(12) United States Patent
Jin et al.

(10) Patent No.: US 11,423,284 B2
(45) Date of Patent: Aug. 23, 2022

(54) SUBGRAPH TILE FUSION IN A CONVOLUTIONAL NEURAL NETWORK

(71) Applicant: Black Sesame International Holding Limited, Santa Clara, CA (US)

(72) Inventors: Xiangdong Jin, Mountain View, CA (US); Fen Zhou, Fremont, CA (US); Chengyu Xiong, San Jose, CA (US)

(73) Assignee: Black Sesame Technologies, Inc, San Jose, CA (US)

( * ) Notice: Subject to any disclaimer, the term of this patent is extended or adjusted under 35 U.S.C. 154(b) by 805 days.

(21) Appl. No.: 16/380,788

(22) Filed: Apr. 10, 2019

(65) Prior Publication Data

US 2020/0082243 A1    Mar. 12, 2020

Related U.S. Application Data

(60) Provisional application No. 62/728,308, filed on Sep. 7, 2018.

(51) Int. Cl.
*G06N 3/04* (2006.01)
*G06N 3/08* (2006.01)
(Continued)

(52) U.S. Cl.
CPC .......... *G06N 3/04* (2013.01); *G06F 16/9024* (2019.01); *G06F 17/15* (2013.01); *G06F 17/16* (2013.01);
(Continued)

(58) Field of Classification Search
CPC .......... G06N 3/041; G06N 3/082; G06N 3/10; G06N 7/046; G06F 16/9024; G06F 17/16;
(Continued)

(56) References Cited

U.S. PATENT DOCUMENTS 9,600,613 B1 *   3/2017  Corbett .................. G06F 30/33
10,217,028 B1 *  2/2019  Wang .................... G06N 3/08
(Continued)

FOREIGN PATENT DOCUMENTS

CN          109376861 B  *  4/2020  ............... G06N 3/04
WO    WO-2017185386 A1  *  11/2017  ........... G06F 13/362
(Continued)

OTHER PUBLICATIONS

Dertat, "Applied Deep Learning—Part4: Convolutional Neural Networks", Towards Data Science, Nov. 8, 2017, 53 pages. (Year: 2017).*
(Continued)

*Primary Examiner* — Phallaka Kik
(74) *Attorney, Agent, or Firm* — Timothy T. Wang; Ni, Wang & Manand, PLLC (57) ABSTRACT

A method of subgraph tile fusion in a convolutional neural network, including partitioning a network into at least one subgraph node, determining a layer order of at least one layer of the at least one subgraph node, determining a input layer of the at least one subgraph node, determining a weight layer of the at least one subgraph node, determining a output layer of the at least one subgraph node and fusing the at least one subgraph node, the input layer, the weight layer and the output layer in the layer order.

20 Claims, 5 Drawing Sheets

(51) Int. Cl.
*G06N 3/10* (2006.01)
*G06N 7/00* (2006.01)
*G06F 16/90* (2019.01)
*G06F 17/16* (2006.01)
*G06F 17/15* (2006.01)
*G06F 30/18* (2020.01)
*G06F 30/27* (2020.01)
*G06F 30/3308* (2020.01)
*G06F 30/392* (2020.01)
*G06F 16/901* (2019.01)
*G06N 7/04* (2006.01)

(52) U.S. Cl.
CPC .............. *G06F 30/18* (2020.01); *G06F 30/27* (2020.01); *G06F 30/3308* (2020.01); *G06F 30/392* (2020.01); *G06N 3/082* (2013.01); *G06N 3/10* (2013.01); *G06N 7/046* (2013.01)

(58) Field of Classification Search
CPC .......... G06F 17/15; G06F 30/18; G06F 30/27; G06F 30/3308; G06F 30/392
USPC ............. 706/15, 16, 31; 703/1, 2, 6, 16, 20; 716/105, 124, 125
See application file for complete search history.

(56) References Cited

U.S. PATENT DOCUMENTS

| | | | | |
|---|---|---|---|---|
| 10,387,531 | B1* | 8/2019 | Vanhoucke | G06F 40/106 |
| 10,499,857 | B1* | 12/2019 | Nguyen | G06T 7/0012 |
| 10,853,449 | B1* | 12/2020 | Nguyen | G16H 30/40 |
| 2017/0200063 | A1* | 7/2017 | Nariyambut Murali | G06K 9/6274 |
| 2017/0206450 | A1* | 7/2017 | Umeda | G06N 3/08 |
| 2018/0033144 | A1* | 2/2018 | Risman | G06T 15/08 |
| 2018/0053085 | A1* | 2/2018 | Matsumoto | G06N 3/0445 |
| 2018/0095632 | A1* | 4/2018 | Leeman-Munk | G06N 3/0454 |
| 2018/0096078 | A1* | 4/2018 | Leeman-Munk | G06F 16/26 |
| 2019/0065910 | A1* | 2/2019 | Wang | G06V 10/82 |
| 2019/0333623 | A1* | 10/2019 | Hibbard | A61N 5/1031 |
| 2020/0082898 | A1* | 3/2020 | Jin | G11C 29/38 |
| 2020/0242734 | A1* | 7/2020 | Wang | G06N 20/10 |
| 2020/0327416 | A1* | 10/2020 | Baker | G06N 3/082 |
| 2020/0334541 | A1* | 10/2020 | Baker | G06N 3/082 |
| 2020/0388021 | A1* | 12/2020 | Song | G06N 3/0454 |
| 2021/0027163 | A1* | 1/2021 | Baker | G06N 3/0454 |

FOREIGN PATENT DOCUMENTS

| | | | | |
|---|---|---|---|---|
| WO | WO-2017185387 | A1 * | 11/2017 | G06F 12/0875 |
| WO | WO-2017185391 | A1 * | 11/2017 | G06F 15/7867 |

OTHER PUBLICATIONS

Shafiee et al., "ISAAC: A Convolutional Neural Network Accelerator with In-Situ Analog Arithmetic in Crossbars", https://www.cs.utah.edu/~rajeev/pubs/isca16.pdf, Oct. 5, 2016, 13 pages. (Year: 2016).*

Yamashita et al., "Convolutional neural networks: an overview and application in radiology", Insights into Imaging, vol. 9, Jun. 22, 2018, pp. 611-629. (Year: 2018).*

* cited by examiner

SUBGRAPH TILE FUSION IN A CONVOLUTIONAL NEURAL NETWORK

BACKGROUND

Technical Field

The instant disclosure is related to convolutional neural networks and specifically improving the efficiency of data flow within the network.

Background

Convolutional neural networks are generally composed of a plurality of convolutional layers and at least one fully connected layer. A convolutional layer has input activations, filters and output activations. Within a convolutional layer filters are convolved and run across the input activations. The filter is multiplied element by element by the input activations and the results are summed. The filter is then shifted by a stride across the input activations to produce the next set of output activations. This process is repeated across an entire layer, with the same input activations and filter values utilized multiple times.

A method is sought to reduce the complexity of the layers by partitioning the network into independently run subgraphs that may be run in parallel.

SUMMARY

A first example method of subgraph tile fusion in a convolutional neural network, including at least one of partitioning a network into at least one subgraph node, determining a layer order of at least one layer of the at least one subgraph node, determining a input layer of the at least one subgraph node, determining a weight layer of the at least one subgraph node, determining a output layer of the at least one subgraph node and fusing the at least one subgraph node, the input layer, the weight layer and the output layer in the layer order.

A second method of subgraph tile fusion in a convolutional neural network, including at least one of partitioning a network operation into at least one subgraph node, determining a layer order of at least one layer of the subgraph node, determining a input layer of the subgraph node, determining a weight layer of the subgraph node, determining a output layer of the subgraph node and fusing the at least one subgraph node, the input layer, the weight layer and the output layer in the layer order.

DETAILED DESCRIPTION OF THE INVENTION

The embodiments listed below are written only to illustrate the applications of this apparatus and method, not to limit the scope. The equivalent form of modifications towards this apparatus and method shall be categorized as within the scope the claims.

Certain terms are used throughout the following description and claims to refer to particular system components. As one skilled in the art will appreciate, different companies may refer to a component and/or method by different names. This document does not intend to distinguish between components and/or methods that differ in name but not in function.

In the following discussion and in the claims, the terms "including" and "comprising" are used in an open-ended fashion, and thus may be interpreted to mean "including, but not limited to . . . ." Also, the term "couple" or "couples" is intended to mean either an indirect or direct connection. Thus, if a first device couples to a second device that connection may be through a direct connection or through an indirect connection via other devices and connections.

Figure 1:
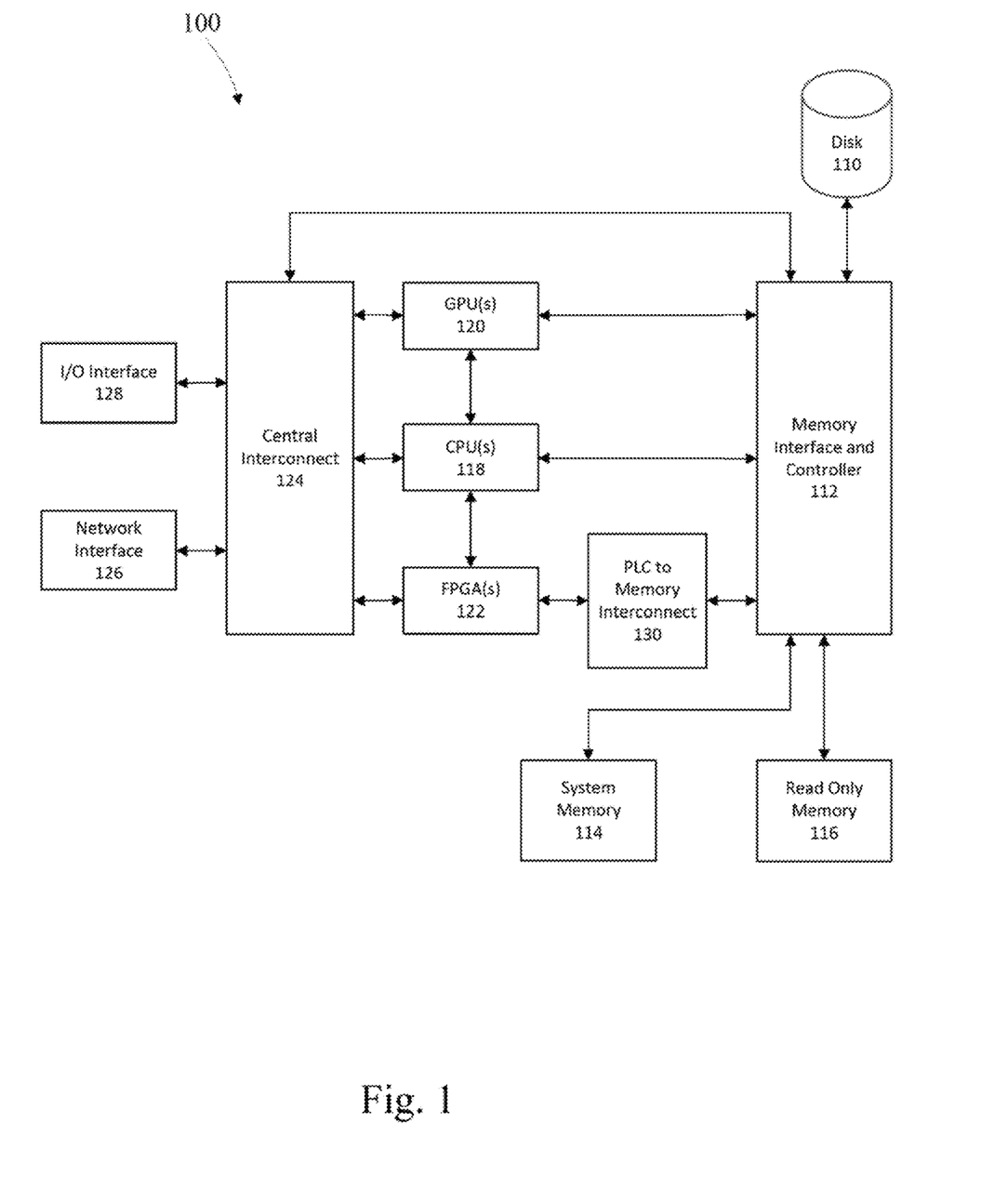
FIG. 1 is a first example system diagram in accordance with one embodiment of the disclosure.
Figure 4:
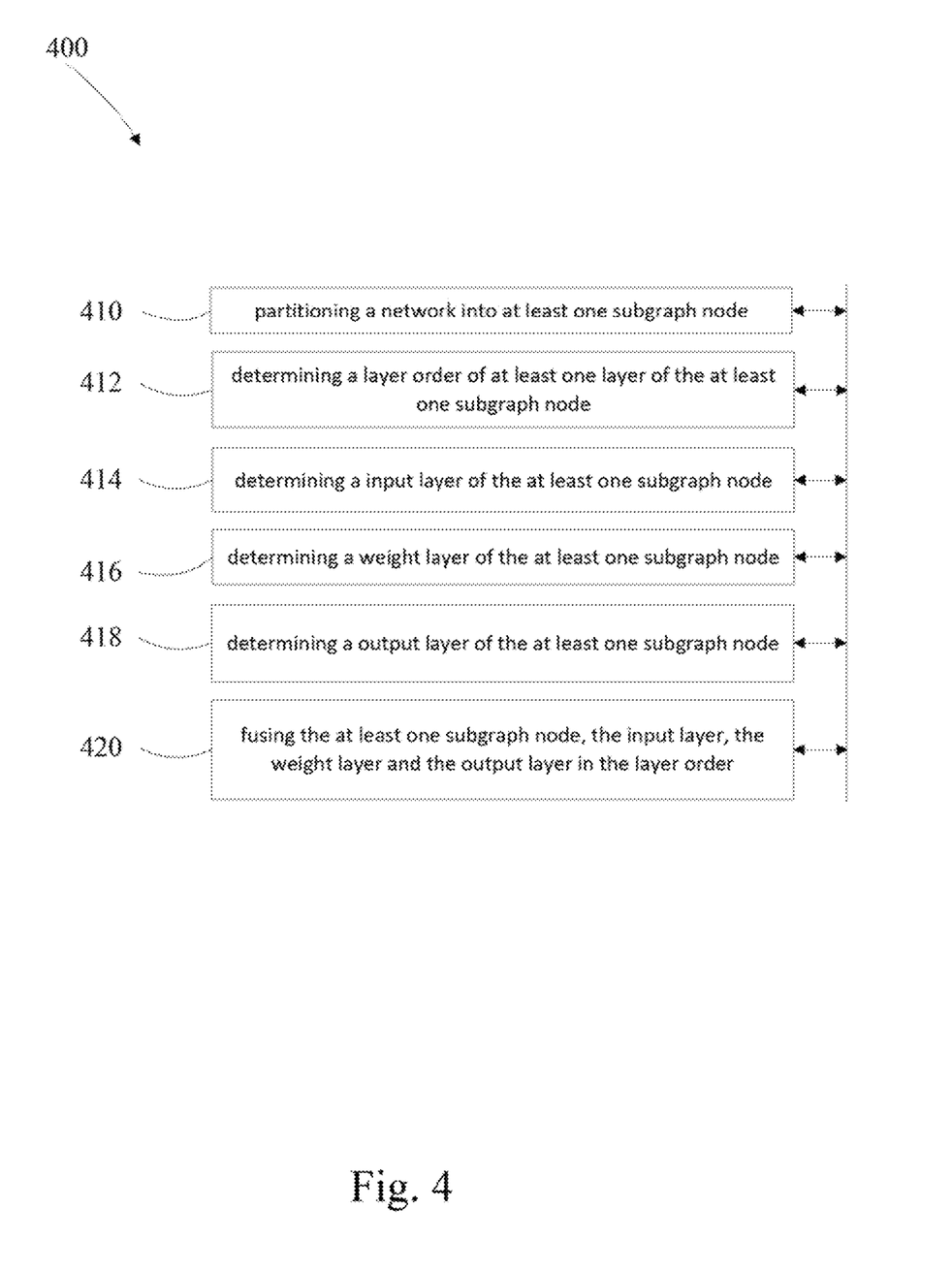
FIG. 4 is a first example of subgraph tile fusion in accordance with one embodiment of the disclosure.
Figure 5:
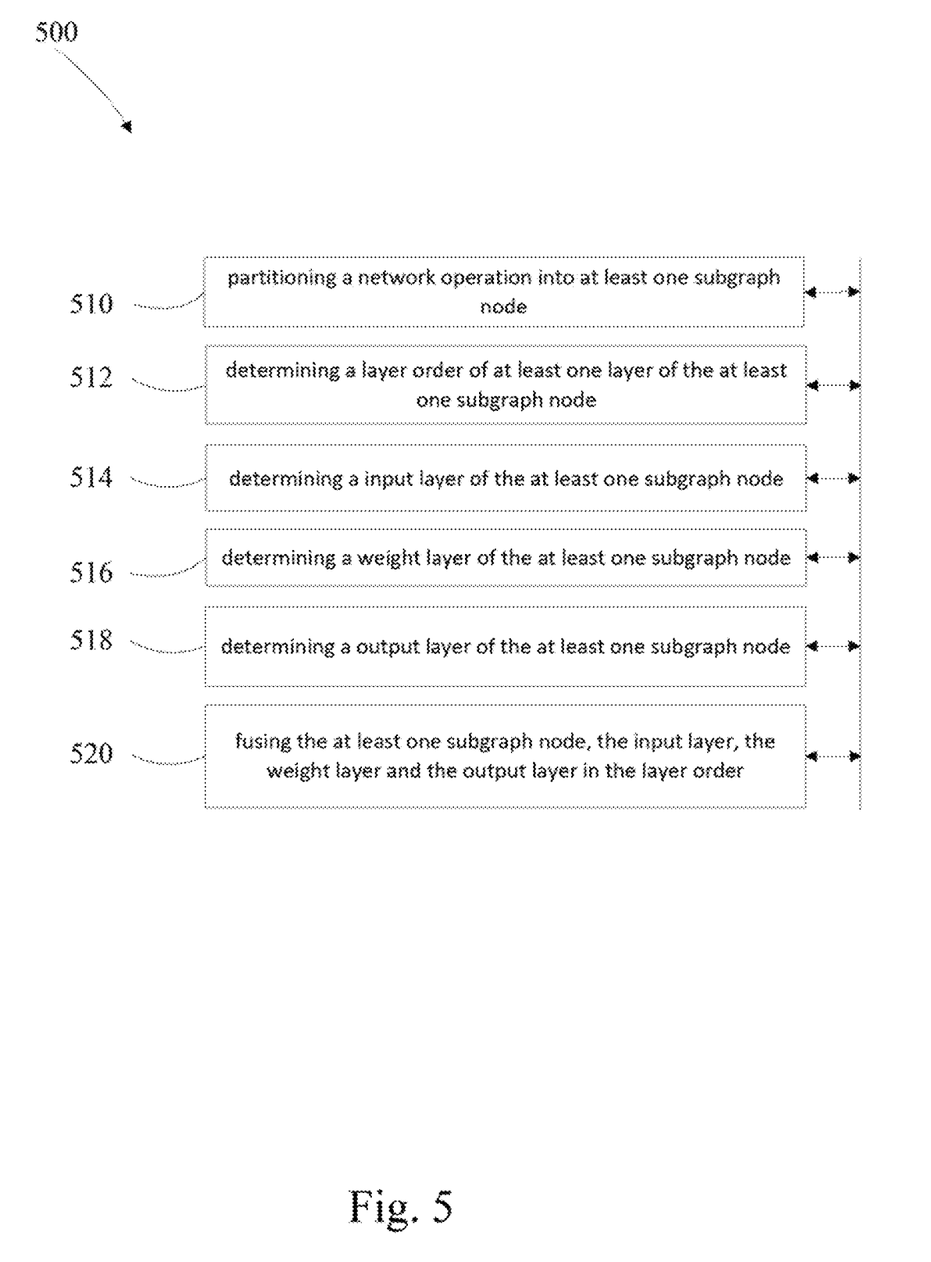
FIG. 5 is a second example of subgraph tile fusion in accordance with one embodiment of the disclosure.

FIG. 1 depicts an example hybrid computational system 100 that may be used to implement neural nets associated with the operation of one or more portions or steps of processes 400 and 500. In this example, the processors associated with the hybrid system comprise a field programmable gate array (FPGA) 122, a graphical processor unit (GPU) 120 and a central processing unit (CPU) 118.

The processing units 118, 120 and 122 have the capability of providing a neural net. A CPU is a general processor that may perform many different functions, its generality leads to the ability to perform multiple different tasks, however, its processing of multiple streams of data is limited and its function with respect to neural networks is very limited. A GPU is a graphical processor which has many small processing cores capable of processing parallel tasks in sequence. An FPGA is a field programmable device, it has the ability to be reconfigured and perform in hardwired circuit fashion any function that may be programmed into a CPU or GPU. Since the programming of an FPGA is in circuit form, its speed is many times faster than a CPU and appreciably faster than a GPU.

There are other types of processors that the system may encompass such as an accelerated processing unit (APUs) which comprise a CPU with GPU elements on chip and digital signal processors (DSPs) which are specialized for performing high speed numerical data processing. Application specific integrated circuits (ASICs) may also perform the hardwired functions of an FPGA; however, the lead time to design and produce an ASIC is on the order of quarters of a year, not the quick turn-around implementation that is available in programming an FPGA.

The graphical processor unit 120, central processing unit 118 and field programmable gate arrays 122 are connected to one other and are connected to a memory interface controller 112. The FPGA is connected to the memory interface through a programmable logic circuit to memory interconnect 130. This additional device is utilized due to the fact that the FPGA is operating with a very large bandwidth and to minimize the circuitry utilized from the FPGA to perform memory tasks. The memory and interface controller 112 is additionally connected to persistent memory disk 110, system memory 114 and read only memory (ROM) 116.

Figure 2:
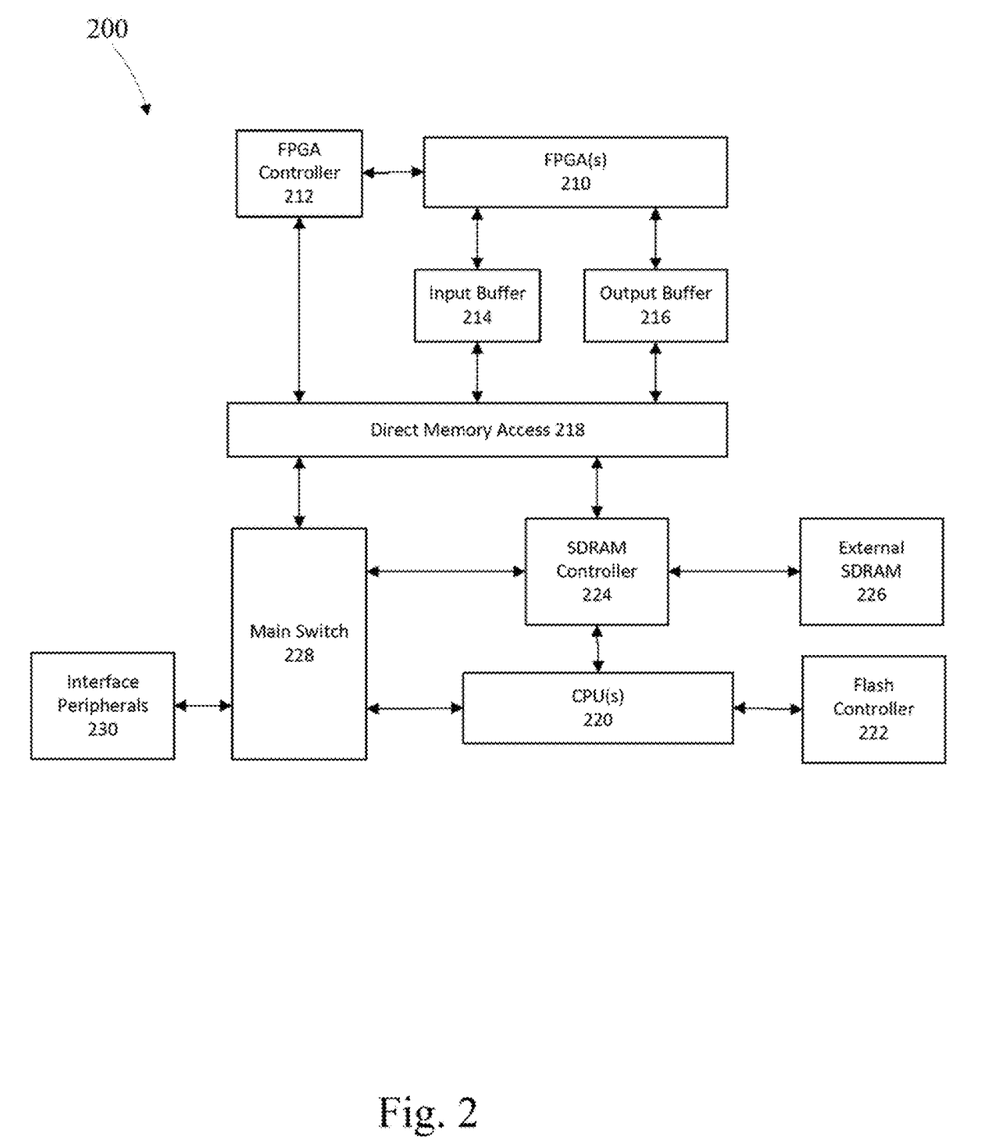
FIG. 2 is a second example system diagram in accordance with one embodiment of the disclosure.

The system of FIG. 2 may be utilized for programming and training the FPGA. The GPU functions well with unstructured data and may be utilized for training, once the data has been trained a deterministic inference model may be found and the CPU may program the FPGA with the model data determined by the GPU.

The memory interface and controller is connected to a central interconnect 124, the central interconnect is additionally connected to the GPU 120, CPU 118 and FPGA 122. The central interconnect 124 is additionally connected to the input and output interface 128 and the network interface 126.

FIG. 2 depicts a second example hybrid computational system 200 that may be used to implement neural nets associated with the operation of one or more portions or steps of process 600. In this example, the processors associated with the hybrid system comprise a field programmable gate array (FPGA) 210 and a central processing unit (CPU) 220.

The FPGA is electrically connected to an FPGA controller 212 which interfaces with a direct memory access (DMA) 218. The DMA is connected to input buffer 214 and output buffer 216, both of which are coupled to the FPGA to buffer data into and out of the FPGA respectively. The DMA 218 has two first in first out (FIFO) buffers one for the host CPU and the other for the FPGA, the DMA allows data to be written to and read from the appropriate buffer.

On the CPU side of the DMA are a main switch 228 which shuttles data and commands to the DMA. The DMA is also connected to an synchronous dynamic random access memory (SDRAM) controller 224 which allows data to be shuttled to and from the FPGA to the CPU 220, the SDRAM controller is also connected to external SDRAM 226 and the CPU 220. The main switch 228 is connected to the peripherals interface 230. A flash controller 222 controls persistent memory and is connected to the CPU 220.

Currently networks have multiple layers with complex data flows, often expressed as a complex computation graph with many computational nodes. Each node represents a network layer or an operational step within the network layer. Traditional approaches process one node at a time sequentially. Data traverses the memory hierarchy for every node.

The instant disclosure discusses subgraph tile fusions in networks. In one example depicted in FIG. 3, the architecture partitions the network into sub-graphs and the input/output/weight data into tensor tiles. In a network the outputs for layers are independent of one another and may be determined in parallel, this allows the partitioning of large layers into subgraphs. For each sub-graph, the input data is read once from the system memory. The operations of the nodes in the sub-graph are fused and controlled internally by an engine mimicking one operation.

Figure 3:
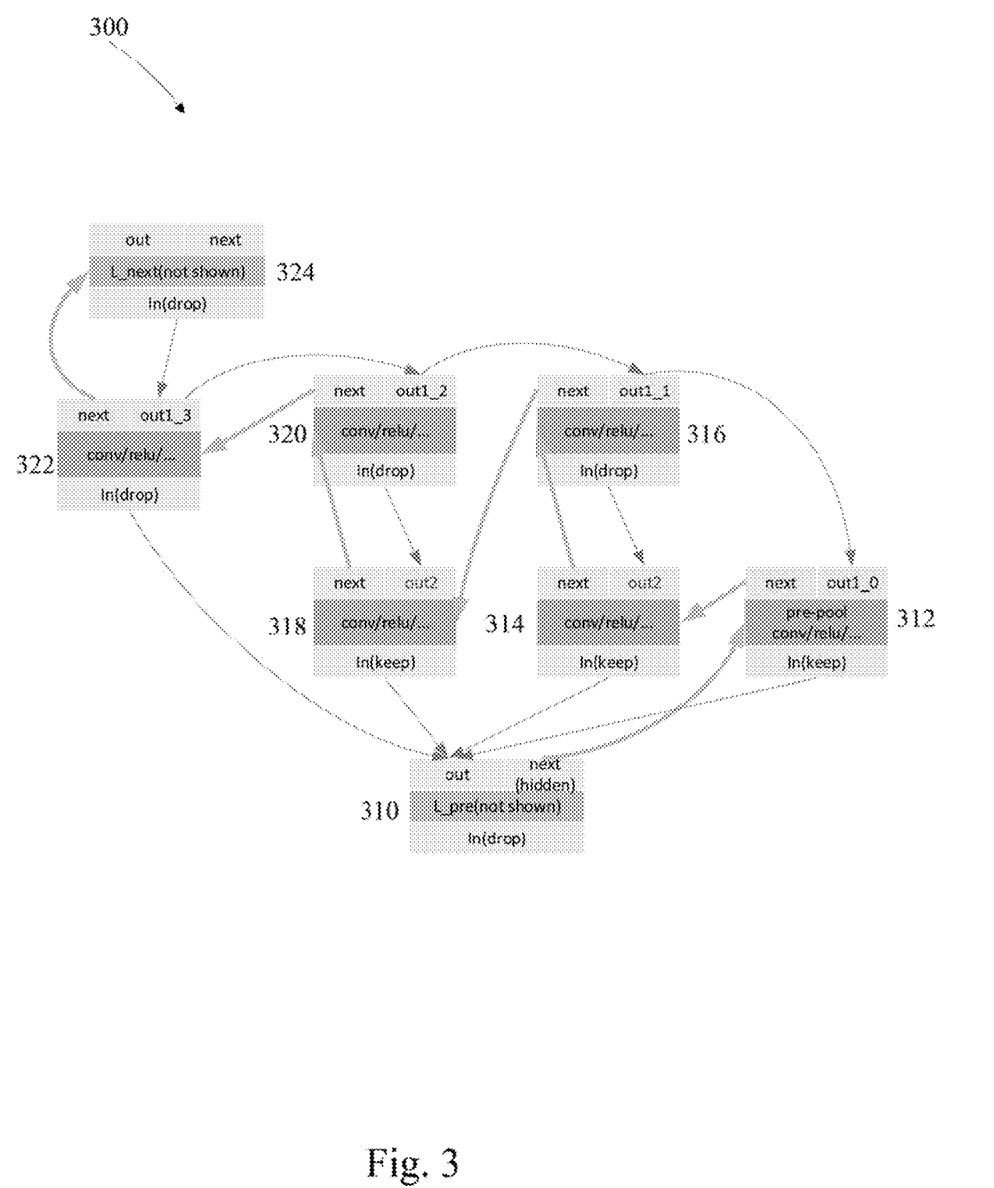
FIG. 3 is an example depiction of subgraph tile fusion of an inception unit in accordance with one embodiment of the disclosure.

The input buffer memory may take the form of an input buffer table, an input buffer stripe and an input buffer tensor tile. The output buffer memory may take the form of an output buffer table, an output buffer stripe and an output buffer tensor tile. The weight buffer memory may take the form of an weight buffer table, a weight buffer stripe and a weight buffer tensor tile.

FIG. 3 depicts eight nodes 310-324 which make up a sub-graph. Node 310 is marked as an L-pre node, it has an input layer which may be dropped and an output layer. Node 312 has a pre-pool layer, convolution layer and a rectified linear (RELU) activation function layer. This node has an input layer which is kept and an output layer out1_0. Nodes 314 and 318 have a convolution layer and a rectified linear activation function layer.

These nodes have input layers which are kept and output layers out2. Nodes 316, 320 and 322 have a convolution layer and a rectified linear activation function layer and input layers that may be dropped. Node 316 has an output layer out1_1, node 322 has an output layer out1_2 and node 322 has an output layer out1_3. Node 324 in marked as an L_next layer that has an input layer which may be dropped and an output layer.

Node may have multiple layers, which would typically have multiple input layers and multiple output layers. Utilizing fused subgraphs, the stack has one input layer reading from a data buffer and one output layer writing to a data buffer. This allows a close coupling of the memory as the movement of data traverses from layer to layer within the fused subgraph. Nodes are executed sequentially; one benefit of this is that the results in internal nodes are hidden.

The nodes of FIG. 3 are executed in the order of node 310, 312, 314, 316, 318, 320, 322 and 324.

The output layer of node 310 is connected to the input layers of 312, 314, 318 and 322, which allows concatenation of the layers within those nodes. The input layers of nodes 316 and 320 are connected to out2 in nodes 314 and 318 respectively. The input layer of node 324 is connected to the output layer of node 322 out1_3, which is connected to the output layer of node 320 out1_2, which is connected to the output layer of node 316 out1_1 and lastly to the output node of 322 out1_0.

Within nodes the layer order dictates the order of execution. In node 312 for example a pooling layer is placed before a convolutional layer which is placed before a RELU layer. In this example the execution of the pooling layer will be considered pre-pooling. The nodes have one output pointer.

Additional layers may have more than one input layers. The input layer for each node may specify whether the input data may be removed or retained to aide in buffer management. The output may be linked by multiple nodes to achieve concatenation.

FIG. 4 depicts a first example method of subgraph the fusion for a network including, partitioning 410 a network into at least one subgraph node and determining 412 a layer order of at least one layer of the at least one subgraph node. The method also includes determining 414 a input layer of the at least one subgraph node, determining 416 a weight layer of the at least one subgraph node, determining 418 a output layer of the at least one subgraph node and fusing 420 the at least one subgraph node, the input layer, the weight layer and the output layer in the layer order.

FIG. 5 depicts a second example method of subgraph tile fusion for a network including, partitioning 510 a network operation into at least one subgraph node and determining 512 a layer order of at least one layer of the subgraph node. The method also includes determining 514 a input layer of the subgraph node, determining 516 a weight layer of the subgraph node, determining 518 a output layer of the subgraph node and fusing 520 the at least one subgraph node, the input layer, the weight layer and the output layer in the layer order.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

References to "one embodiment," "an embodiment," "some embodiments," "various embodiments", or the like indicate that a particular element or characteristic is included in at least one embodiment of the invention. Although the phrases may appear in various places, the phrases do not necessarily refer to the same embodiment. In conjunction with the present disclosure, those skilled in the art will be able to design and incorporate any one of the variety of mechanisms suitable for accomplishing the above described functionalities.

It is to be understood that the disclosure teaches just one example of the illustrative embodiment and that many variations of the invention can easily be devised by those skilled in the art after reading this disclosure and that the scope of then present invention is to be determined by the following claims.

What is claimed is:

1. A method of subgraph tile fusion in a convolutional neural network, comprising:
    partitioning a network into at least one subgraph node;
    determining a layer order of at least one layer of the at least one subgraph node;
    determining a input layer of the at least one subgraph node;
    determining a weight layer of the at least one subgraph node;
    determining a output layer of the at least one subgraph node; and
    fusing the at least one subgraph node, the input layer, the weight layer and the output layer in the layer order.

2. The method of subgraph tile fusion of claim 1, further comprising controlling the fused at least one subgraph node control from within the fused at least one subgraph node.

3. The method of subgraph tile fusion of claim 1, further comprising receiving input from an input buffer table.

4. The method of subgraph tile fusion of claim 3, further comprising partitioning the input buffer table into a plurality of input buffer tensor tiles.

5. The method of subgraph tile fusion of claim 1, further comprising sending output from an output buffer table.

6. The method of subgraph tile fusion of claim 5, further comprising partitioning the output buffer table into a plurality of output buffer tensor tiles.

7. The method of subgraph tile fusion of claim 1, further comprising receiving weight data from a weight buffer table.

8. The method of subgraph tile fusion of claim 7, further comprising partitioning the weight buffer table into a plurality of weight buffer tensor tiles.

9. The method of subgraph tile fusion of claim 1, further comprising executing the at least one subgraph node in the layer order.

10. The method of subgraph tile fusion of claim 1, further comprising adding an additional layer having two input layers.

11. The method of subgraph tile fusion of claim 1, further comprising retaining the input layer based on the input.

12. The method of subgraph tile fusion of claim 1, further comprising linking the output layer to a set of multiple nodes.

13. A method of subgraph tile fusion in a convolutional neural network, comprising:
   partitioning a network operation into at least one subgraph node;
   determining a layer order of at least one layer of the subgraph node;
   determining a input layer of the subgraph node;
   determining a weight layer of the subgraph node;
   determining a output layer of the subgraph node; and
   fusing the at least one subgraph node, the input layer, the weight layer and the output layer in the layer order.

14. The method of subgraph tile fusion of claim 13, further comprising:
   receiving input from an input buffer table;
   receiving weight data from a weight buffer table; and
   sending output from an output buffer table.

15. The method of subgraph tile fusion of claim 14, further comprising:
   partitioning the input buffer table into a plurality of input buffer tensor tiles;
   partitioning the output buffer table into a plurality of output buffer tensor tiles; and
   partitioning the weight buffer table into a plurality of weight buffer tensor tiles.

16. The method of subgraph tile fusion of claim 14, further comprising:
   reading one input from the input buffer table; and
   outputting one output from the output buffer table.

17. The method of subgraph tile fusion of claim 13, further comprising executing the at least one subgraph node in the layer order.

18. The method of subgraph tile fusion of claim 13, further comprising adding an additional layer having two input layers.

19. The method of subgraph tile fusion of claim 13, further comprising retaining the input layer based on the input.

20. The method of subgraph tile fusion of claim 13, further comprising linking the output layer to a set of multiple nodes.

* * * * *